US006957976B2

(12) United States Patent
Zhang

(10) Patent No.: US 6,957,976 B2
(45) Date of Patent: Oct. 25, 2005

(54) I/O CONNECTOR WITH LOCK-RELEASE MECHANISM

(75) Inventor: Hongbo Zhang, Kunsan (CN)

(73) Assignee: Hon Hai Precision Ind. Co., LTD, Taipei Hsien (TW)

( * ) Notice: Subject to any disclaimer, the term of this patent is extended or adjusted under 35 U.S.C. 154(b) by 0 days.

(21) Appl. No.: 10/951,484

(22) Filed: Sep. 27, 2004

(65) Prior Publication Data

US 2005/0070148 A1 Mar. 31, 2005

(30) Foreign Application Priority Data

Sep. 26, 2003 (TW) .............................. 92217370 U

(51) Int. Cl.[7] .............................. H10R 13/627
(52) U.S. Cl. .............................. 439/358
(58) Field of Search .............................. 439/358, 327, 439/353, 357, 350, 540.1

(56) References Cited

U.S. PATENT DOCUMENTS

| | | | | |
|---|---|---|---|---|
| 5,975,957 | A | 11/1999 | Noda et al. | |
| 6,099,339 | A | 8/2000 | Yanagida et al. | |
| 6,132,231 | A | 10/2000 | Suzuki | |
| 6,152,754 | A * | 11/2000 | Gerhardt et al. | 439/325 |
| 6,165,006 | A * | 12/2000 | Yeh et al. | 439/490 |
| 6,254,417 | B1 | 7/2001 | Pan | |
| 6,454,589 | B1 * | 9/2002 | Yeh | 439/352 |
| 6,457,987 | B1 * | 10/2002 | Yeh | 439/352 |
| 6,558,183 | B1 * | 5/2003 | Ji et al. | 439/358 |
| 6,705,899 | B1 * | 3/2004 | Ji | 439/660 |
| 6,863,546 | B2 * | 3/2005 | Yang et al. | 439/79 |
| 6,865,369 | B2 * | 3/2005 | Semmeling et al. | 434/357 |
| 2004/0137779 | A1 * | 7/2004 | Wei | 439/358 |
| 2005/0026492 | A1 * | 2/2005 | Zhang et al. | 439/358 |
| 2005/0048830 | A1 * | 3/2005 | Li et al. | 439/358 |
| 2005/0064758 | A1 * | 3/2005 | Li et al. | 439/358 |

* cited by examiner

*Primary Examiner*—Gary Paumen
*Assistant Examiner*—Phuongchi Nguyen
(74) *Attorney, Agent, or Firm*—Wei Te Chung

(57) ABSTRACT

A connector (100) includes a cover defining a receiving space for receiving a terminal module (3). A notch (15) is defined through a side wall of the cover. A concaved stop portion (151) is defined in the side wall of the cover and communicating with the notch. The terminal module has a number of terminals (33) held therein and includes a forwardly projecting mating portion (32) beyond the cover. A lock member (34) is received in the housing for mating with a mating connector. A lock-release button (24) is received in the notch for urging the lock member into a release position and includes a fixing end fixed to the cover and a free operating base (240) swinging about the fixing end. A stop plate (241) projects from the free operating base to engage with the stop portion of the cover for preventing the lock-release button disengaging the notch.

3 Claims, 5 Drawing Sheets

I/O CONNECTOR WITH LOCK-RELEASE MECHANISM

BACKGROUND OF THE INVENTION

1. Field of the Invention

The present invention generally relates to an input/output (I/O) connector, and more particularly, to an I/O connector having an improved lock-release mechanism.

2. Description of the Prior Art

Portable communications devices, such as cellular telephones, pagers, personal data assistants (PDA) etc., have been widely used in everyday life in recent years. Such devices frequently need to be charged, or connected to another device, such as a personal computer (PC) to upload or download information. As is known, an input/output (I/O) connector is employed to establish electrical connection between electronic devices. Such an I/O connector generally includes a housing body and a plurality of contacts extending outside the housing for mating with the electrical device. The housing has a pair of lock members in opposite side walls thereof and a pair of cantilevered release buttons corresponding to the lock members. Each lock member has a resilient arm and a hook portion projects upwardly on the free end of the resilient arm. A cam section is provided on the release button. A cam follower is provided on the resilient arm for exerting an inward squeezed force on the resilient arm. To connect the connector to the electrical device, the hook portions of the lock members are pressed inwardly and the contacts electrically connect with the electrical device. The resilient arms spring back so that the hook portions engage the engaging portions of the electrical device. To disengage the connector from the electrical device, the release buttons are squeezed toward the housing body, the cam sections press inwardly corresponding cam followers of the resilient arms. The hook portions of the resilient arms are released from the engagement with the mating connector.

However, such the I/O connector of prior art involves such problems as the release button is of a cantilevered configuration with a base locking with the housing body. The release button is inclined to project outwardly and cannot return to its normal position after a period of use. The outwardly projecting release buttons are easily damaged by unexpected external force. In addition, the engagement between the cam section of the release unite and the cam follower of the resilient arm is of a line-to-line fashion, likely to result an unreliable connection therebetween.

Hence, an improved I/O connector is required to overcome the disadvantages of the prior art.

BRIEF SUMMARY OF THE INVENTION

A primary object of the present invention is to provide an I/O connector with improved lock-release buttons which are compact and are able to provide stable lock and release operation.

To fulfill the above-mentioned objects, according to a preferred embodiment of the present invention, an I/O connector includes a top cover and a bottom cover interlocked with the top cover defining a receiving space therebetween. The top cover defines a pair of notches at side walls thereof and each has a concaved stop portion communicating with the notch. A terminal module is received in the receiving space. The terminal module is adapted for receiving a plurality of terminals and includes a forwardly projecting mating portion beyond the cover. A pair of lock members are received in the housing for mating with a mating connector. A pair of lock-release buttons are received in the notches for urging the lock members into a release position and each include a fixing end fixed to the bottom cover and a free operating base swinging about the fixing end. A stop plate projects from each free operating base to engage with the stop portion of the cover for preventing the lock-release button from disengaging the notch.

Other objects, advantages and novel features of the invention will become more apparent from the following detailed description when taken in conjunction with the accompanying drawings.

BRIEF DESCRIPTION OF THE DRAWINGS

The foregoing summary, as well as the following detailed description of the embodiments of the present invention, will be better understood when read in conjunction with the appended drawings. For the purpose of illustrating the invention, there are shown in the drawings embodiments which are presently preferred. As should be understood, however, the invention is not limited to the precise arrangements and instrumentalities shown. In the drawings.

DETAILED DESCRIPTION OF THE PREFERRED EMBODIMENT

Figure 1:
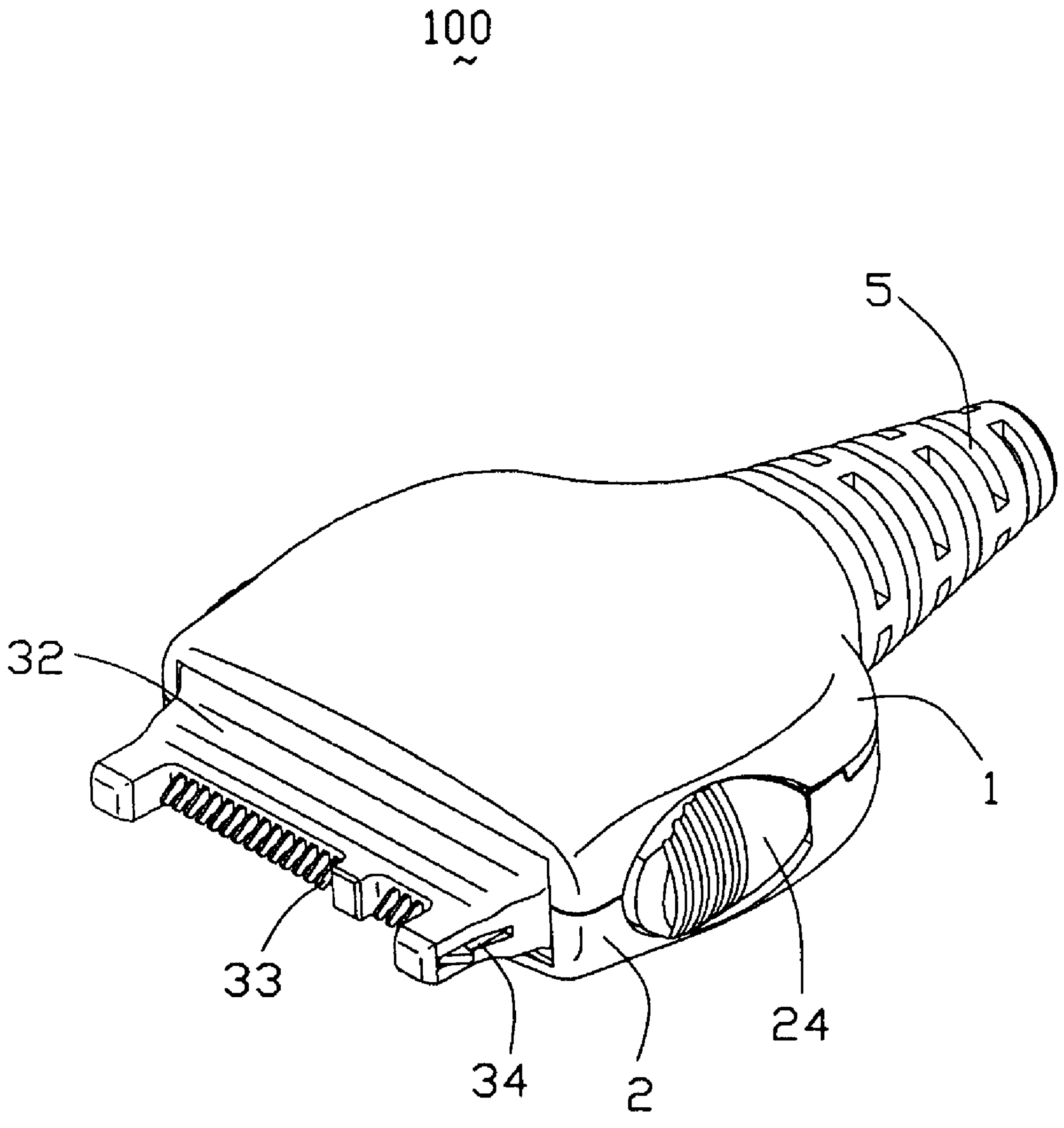
FIG. 1 is a perspective view of an I/O connector according to the present invention.

Referring to the drawings in greater detail, and first to FIGS. 1–4, an input/output (I/O) connector 100 according to the present invention has a two-part construction including a top cover 1 and a bottom cover 2. The top cover 1 interlocks with the bottom cover 2 thus defining a receiving space (not labeled) thererbetween for receiving a terminal module 3. An internal printed circuit board (PCB) 4 is assembled to the terminal module 3. A strain relief 5 is assembled at rear ends of the assembled covers 1, 2.

The top cover 1 defines a pair of downwardly projecting brackets 11 and forms a pair of downwardly projecting first embossments 12 at a front portion of an inner surface thereof. The first embossments 12 position between the brackets 11. A plurality of first supporting frames 13 are downwardly formed at a middle inner surface of the top cover 1. A pair of mounting slots 14 are defined at a rear end of the top cover 1. A pair of notches 15 are symmetrically formed on opposite downwardly extending side walls of the top cover 1. A concaved stop portion 151 is defined in an inner surface of each side wall and communicate with a front end of each notch 15.

The bottom cover 2 defines a pair of low holes 21 and forms a pair of upwardly projecting second embossments 22 at a front portion of an inner surface thereof. The second embossments 22 position between the low holes 21. A plurality of second supporting frames 23 are upwardly formed at middle inner surface of the bottom cover 2. A pair of lock-release buttons 24 are provided respectively at opposite side walls of the bottom cover 2. Each lock-release button 24 has a rear fixing end fixed with an inner surface of the bottom cover 2 and a front free operating base 240 swing about the fixing end for being squeezed to take the I/O connector 100 into a released position. In this embodiment, the lock-release buttons 24 are integrally molded with the cover. The operating base 240 is substantially quarter-cartouche shaped. A plurality of raised serrated bosses (not labeled) is provided on outer surfaces of operating base 240 for engagement by an operator's thumb or finger. A stop plate 241 projects upwardly and forwardly from the operating base 240. The stop plate 241 engages with the stop portion 151 of the top cover 1 for preventing an outward movement of the lock release button 24.

The terminal module 3 is one-piece structure unitarily molded of dielectric material such as plastic or the like and includes a generally U-shaped dielectric housing body 31 and a forwardly projecting mating portion 32 for engaging with a mating portion of a mating connector. The housing body 31 defines a plurality of passageways 311 and forwardly extending through a middle of the mating portion 32 for receiving a plurality of terminals 33. A pair of grooves 312 horizontally extend front-to-rear at opposite sides of the housing body 31 and the mating portion 32 for retaining and confining a pair of retractably lock members 34 wherein most portions of the groove 312 are outwardly exposed to the exterior in a lateral direction except portions blocked by the partition walls 3123, 3124 so as to form only the portions 3121 and 3122 of the groove 312 are outwardly exposed to the exterior in the lateral direction. The housing body 31 has a pair of concaved cutouts 313 at each side for engaging with stop plates 241 of the lock-release buttons 24 when the lock-release buttons 24 are pressed. Corresponding to the brackets 11 and the first embossments 12 of the top cover 1, a pair of bosses 314*a* and a fist rib 315*a* are formed on a lower surface of the housing body 31. Corresponding to the low holes 21 and the second embossments 22 of the bottom cover 2, a pair of poles 314*b* and a second rib 315*b* are formed on an upper surface of the housing body 31.

Figure 4:
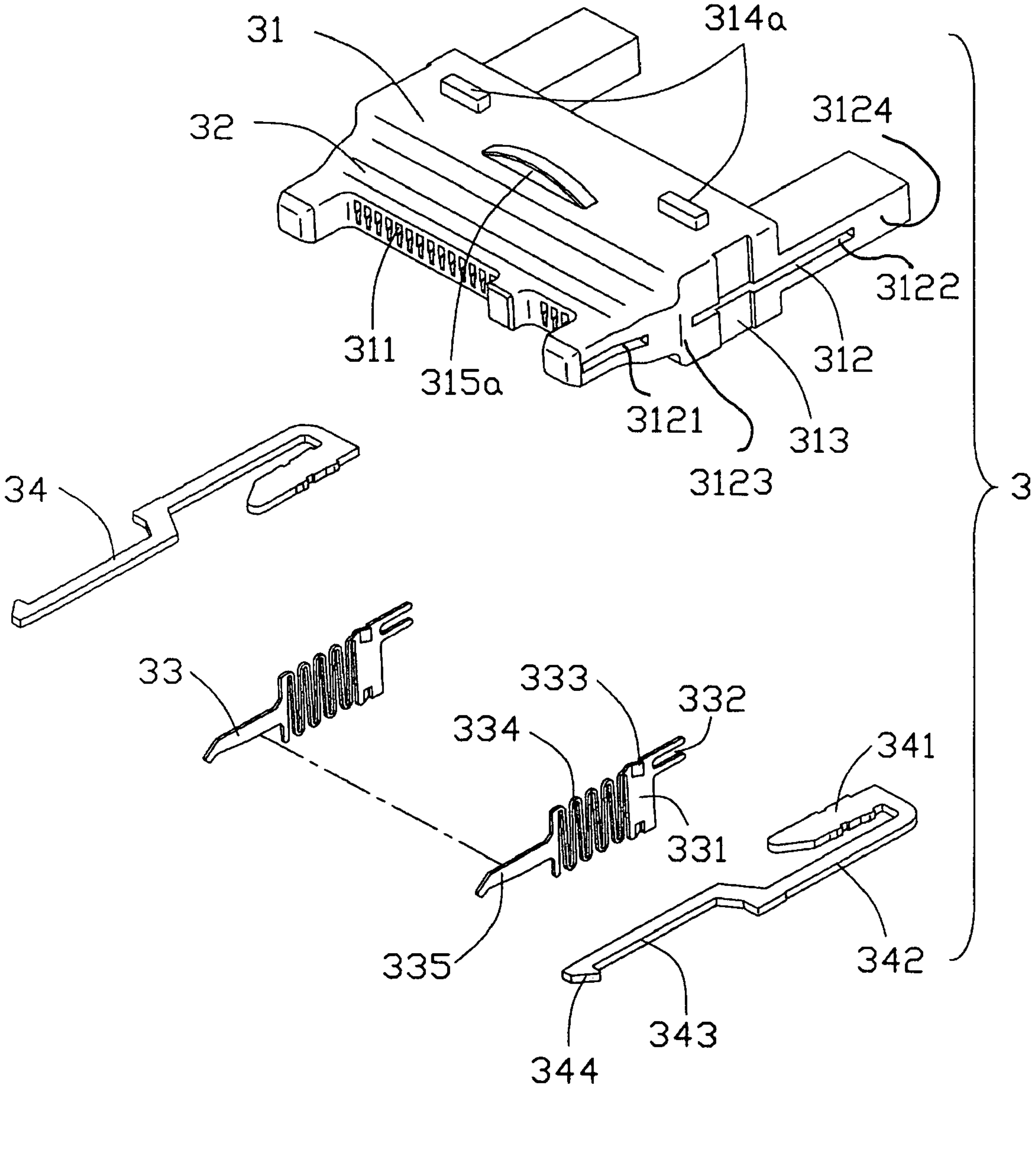
FIG. 4 is an exploded view of a terminal module of the I/O connector.
Figure 5:
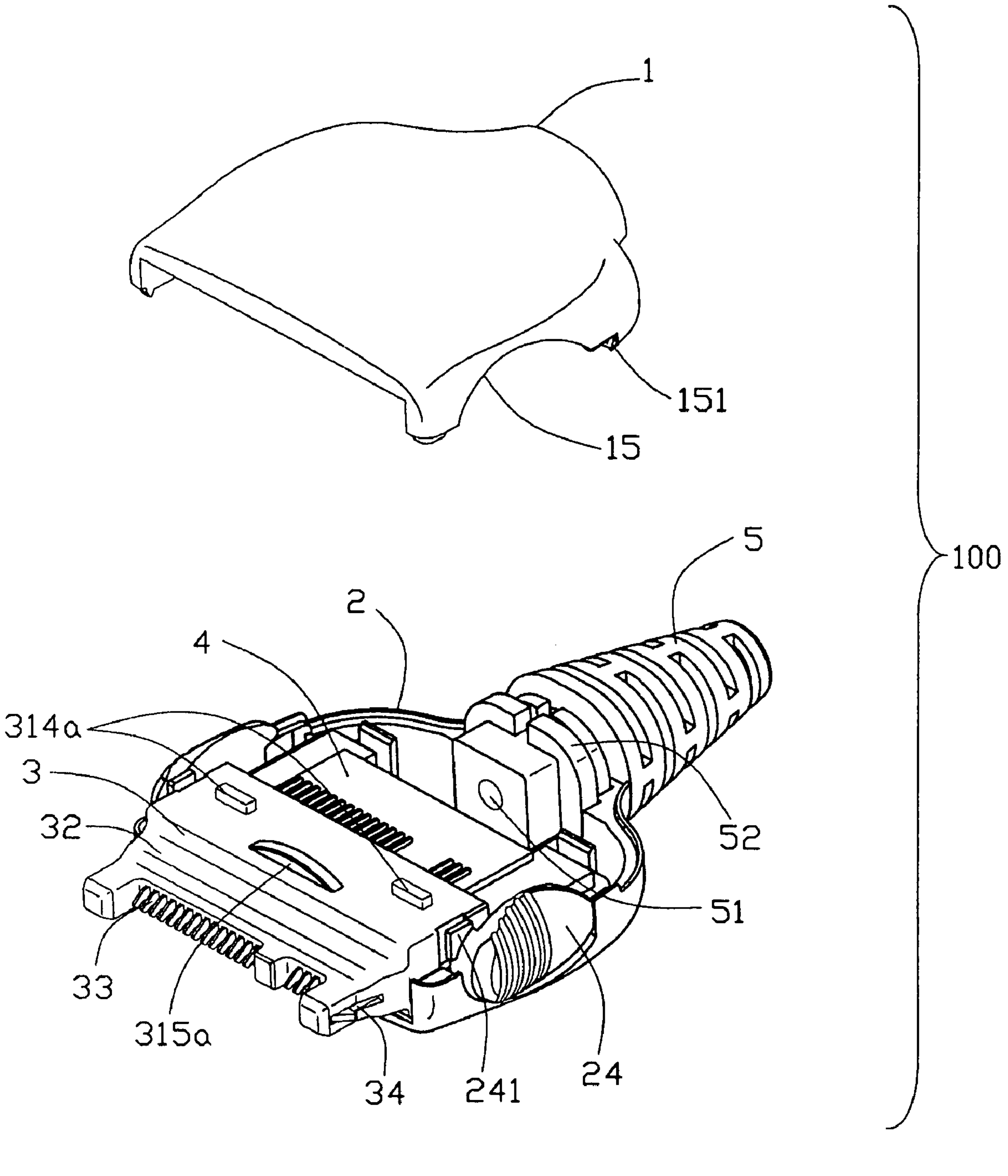
FIG. 5 is an assembled view of FIG. 2, wherein an upper cover is upwardly lifted for clarity.

Referring to FIG. 4, the terminal 33 includes a base portion 331 and a solder portion 332 extending rearwardly from a rear end of the base portion 331. A concave 333 is formed at the base portion 331 for securely engaging with the passageways 311 and the solder portion 332. A contact portion 335 extends frontward from a front end of the base portion 331 and connects to the base portion 331 via a spring portion 334 which can cushion the force from the contact portion 335 received from a mating connector.

The pair of lock members 34 are accommodated in the grooves 312 of the housing body 31. Each lock members 34 comprises a retention portion 341, a press portion 342 with the retention portion 341 forming a generally U-shaped structure, a resilient arm 343 extending from the press portion 342 and a hook portion 344 on a free end of the resilient arm 343 being exposed to an outside.

Figure 2:
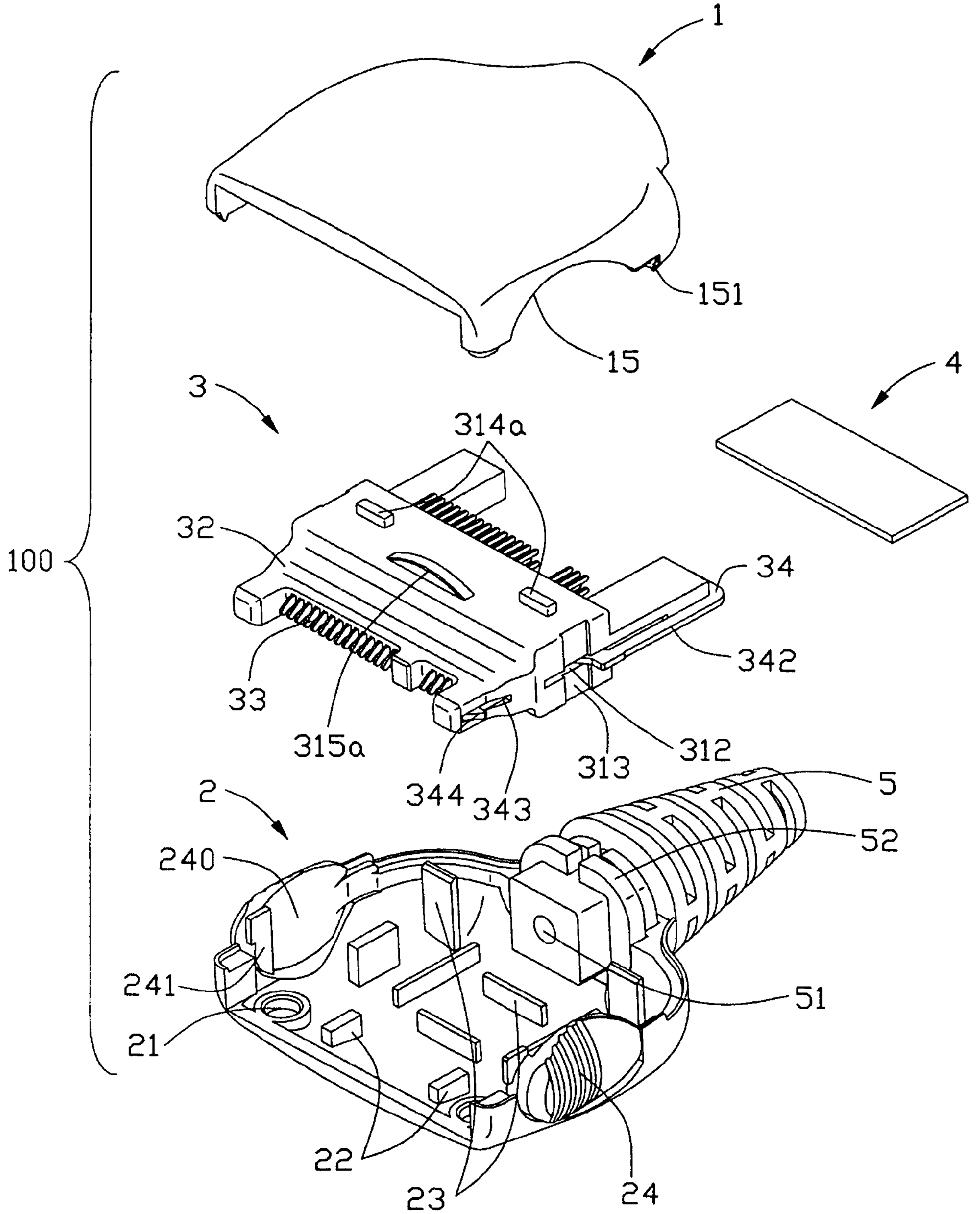
FIG. 2 is an exploded view of FIG. 1.
Figure 3:
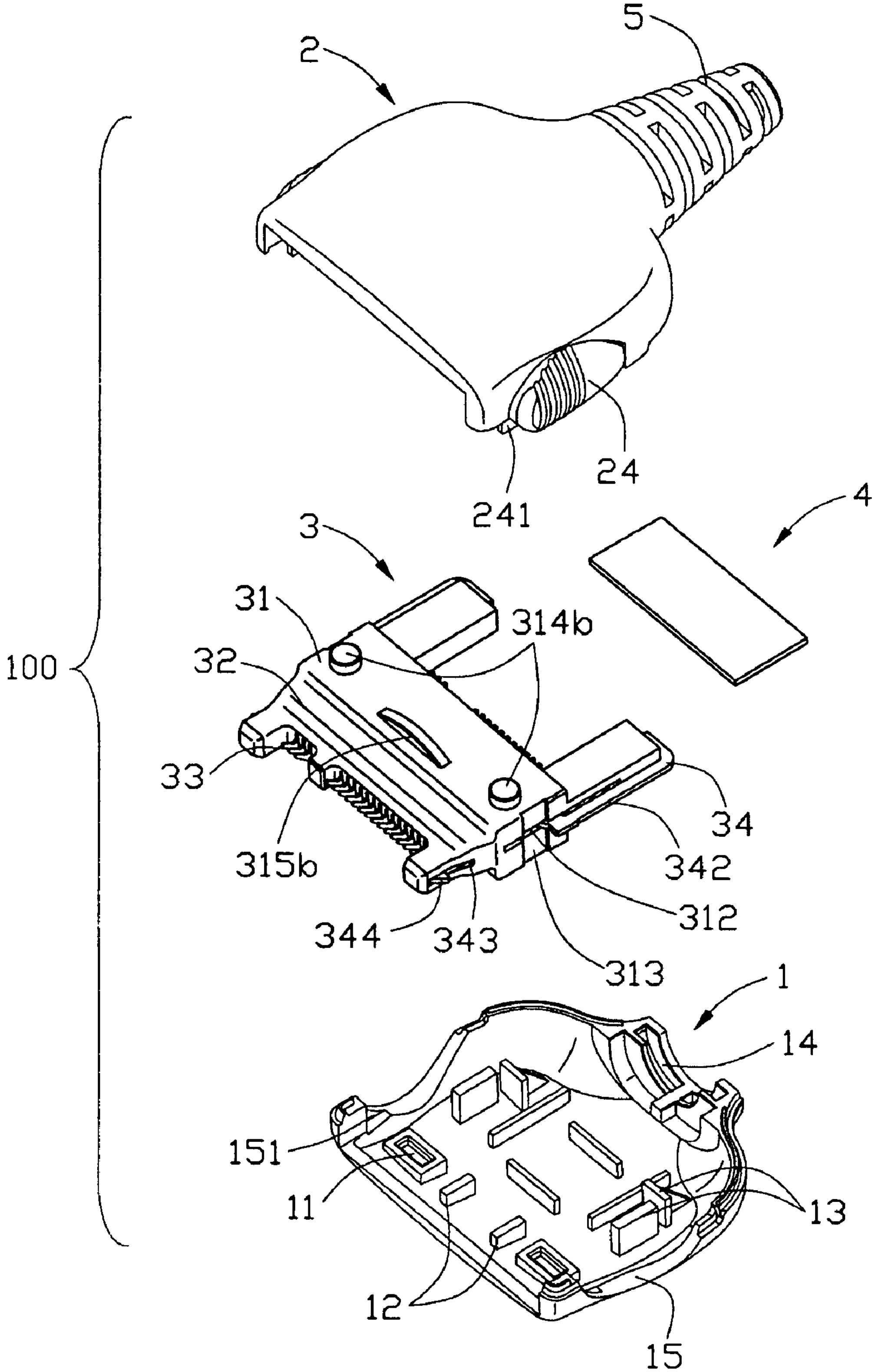
FIG. 3 is an exploded view similar to FIG. 2, but taken from another perspective.

Referring to FIG. 2, the strain relief 5 has a hole 51 therethrough in a front-to-rear direction for receiving an end of a mating cable and a pair of mounting flanges 52 at front portion thereof. The mounting flanges 52 are provided for cooperating with the mounting slots 14 of the top cover 1.

Referring to FIGS. 1–5, in assembly, the terminals 33 are received in the passageways 311 of the terminal module 3 with the solder portions 332 rearwardly extending out of the middle housing body 31 and the contact portions 335 forwardly extending out of the front edge of the mating portion 32. The lock members 34 are horizontally installed into the grooves 312 of housing body 31, with the press portions 342 and the hook portions 344 exposed out of the side walls of the housing body 31 wherein the resilient arm 343 with the hook portion 344 is first inwardly and laterally inserted into the portion 3122, and successively the whole lock member 34 is moved along a lengthwise direction of the groove 312 until the U-shaped retention portion 341 and pressing portion 341 engaged with the partition wall 3124. The PCB 4 is soldered to the solder portions 332 of the terminals 33 and a free edge of the PCB 4 blocked in the terminal module 3. The assembled terminal module 3 is mounted onto the bottom cover 2 (referring to FIG. 5) with the PCB 4 being supported by the second supporting frames 23, and with the posts 314*b* and the second rib 315*b* of the terminal module 3 respectively engaging with the lower holes 21 and the second embossments 22 of the bottom cover 2. The mating portion 32. extends beyond a front edge of the bottom cover 2 for mating with the mating connector.

The top cover 1 is interlocked with the bottom cover 2 thereafter. The bosses 314*a* and the first rib 315*a* of the terminal module 3 respectively engage with the brackets 11 and the first embossments 12 of the top cover 1, thereby securing holding the terminal module 3 between the top cover 1 and the bottom cover 2. The mounting slots 14 mount with the mounting flanges 52 of the strain relief 5. The notches 15 of the top cover 1 retain the lock-release buttons 24 with the stop portions 151 engaging with corresponding stop plates 241, thereby securing holding the lock-release buttons 24 between the top cover 1 and the bottom cover 2.

When mating with the mating connector is desired, the lock-release buttons 24 of the I/O connector 100 are inwardly pressed. The operating bases 240 of the lock-release buttons 24 inwardly depress corresponding pressing portions 342 of the lock members 34. The pressing portions 342 urge the resilient arms 343 and the hook portions 344 move inwardly, the stop plates 241 of the lock-release buttons 24 bias against corresponding cutouts 313 of the terminal module 3, thereby rendering the lock members 34 received in the grooves 312 completely and allowing the mating occurs. When the mating completed, the lock-release buttons 24 are released. The press portions 342 and the resilient arms 343 move outwardly, whereby the hook portions 344 of the I/O connector 100 respectively engage with counterpart locking portions of the mating connector. A locking state between the I/O connector 100 and the mating connector is established.

Similarly, to disengage the I/O connector 100 from the mating connector, the lock-release buttons 24 are inwardly depressed, the pressing portions 342 of the lock members 34 inwardly deflect resilient arms 343 and the hook portions 344, thereby disengaging the hook portions 344 from the counterpart lock portions of the mating connector and releasing the locking between the I/O connector 100 and the mating connector.

It is to be understood, however, that even though numerous, characteristics and advantages of the present invention have been set fourth in the foregoing description, together with details of the structure and function of the invention, the disclosed is illustrative only, and changes may be made in detail, especially in matters of shape, size, and arrangement of parts within the principles of the invention to the full extent indicated by the broad general meaning of the terms in which the appended claims are expressed.

What is claimed is:

1. An I/O connector, comprising:

a cover defining a receiving space, a notch communicating with the receiving space and a stop portion adjacent to the notch;

a terminal module received in the receiving space, the terminal module including a dielectric housing and a plurality of terminals held in the housing;

a lock member assembled in the housing; and a lock-release button received in the notch for urging the lock member into a released position, the button including a fixing end fixed to the cover and a free operating base swinging about the fixing end, a stop plate projecting from the free operating base for preventing the lock-release button from disengaging the notch;

wherein the cover includes a top cover and a bottom cover interlocked with the top cover, the receiving space being defined between the top and the bottom covers;

wherein the top cover comprises a side wall, the notch being defined through the side wall of the top cover;

wherein the stop portion is recessed from an inner surface of the side wall of the top cover and communicating with the notch, the stop portion engaging with the stop plate of the lock-release button;

wherein the lock member includes a retention portion, a press portion bent from the retention portion, a resilient arm flexibly extending from the press portion and a hook portion projecting outwardly from a distal end of the resilient arm;

wherein the terminal module defines a groove receiving the lock member, the press portion projecting beyond the groove for being depressed by the lock-release button, the hook portion being exposed to an outside;

wherein the terminal module has an internal printed circuit board electrically connecting with the terminals.

2. An I/O connector, comprising:

a cover;

a terminal module received in the receiving space, the terminal module including a dielectric housing and a plurality of terminals held in the housing for mating with a complementary connector along a lengthwise direction, said housing defining a groove with at least a rear partition walls aside for being not directly outwardly exposed to an exterior in a lateral direction perpendicular to said lengthwise direction; and a lock member including a retention and pressing portion commonly defining a U-shaped structure, a resilient arm extending from the pressing portion with a hook at a free end; wherein the resilient arm of the lock member is initially inserted into the groove in another lateral direction opposite to said lateral direction, and successively the whole lock member is moved forwardly in the lengthwise direction until the U-shaped structure engaged with the rear partition;

wherein the pressing portion projects beyond the groove for being depressed by a lock-release button, the hook being exposed to an outside.

3. The I/O connector according to claim 2, further including a front partition wall for blocking the resilient arm from the exterior in said lateral direction.

* * * * *